US009859045B2

(12) United States Patent
Hollis et al.

(10) Patent No.: US 9,859,045 B2
(45) Date of Patent: Jan. 2, 2018

(54) SUPERCONDUCTING MAGNET

(71) Applicant: Oxford Instruments Nanotechnology Tools Limited, Oxon (GB)

(72) Inventors: Timothy Hollis, Oxon (GB); Wenbin Ma, Oxon (GB)

(73) Assignee: Oxford Instruments Nanotechnology Tools Limited (GB)

( * ) Notice: Subject to any disclaimer, the term of this patent is extended or adjusted under 35 U.S.C. 154(b) by 0 days.

(21) Appl. No.: 15/140,218

(22) Filed: Apr. 27, 2016

(65) Prior Publication Data
US 2016/0322144 A1    Nov. 3, 2016

(30) Foreign Application Priority Data

May 1, 2015    (GB) .................................. 1507550.0

(51) Int. Cl.
*H01F 6/06*    (2006.01)
*G01R 33/3815*    (2006.01)

(52) U.S. Cl.
CPC ........... *H01F 6/06* (2013.01); *G01R 33/3815* (2013.01)

(58) Field of Classification Search
CPC .... G01R 33/38; G01R 33/381; G01R 33/387; G01R 33/3875; G01R 33/42;
(Continued)

(56) References Cited

U.S. PATENT DOCUMENTS 4,924,198 A  *  5/1990  Laskaris ............ G01R 33/3815
                                                174/15.4
4,987,398 A  *  1/1991  Bessho ................... H01F 7/202
                                                335/209
(Continued)

OTHER PUBLICATIONS

S. Matsumoto, et al., "Generation of 24 T at 4.2 K Using a Layer-Wound GdBCO Insert Coil with Nb3Sn and Nb—Ti External Magnetic Field Coils", Superconductor Science and Technology, Vo. 25, 2012, pp. 1-5.

*Primary Examiner* — Shawki S Ismail
*Assistant Examiner* — Lisa Homza
(74) *Attorney, Agent, or Firm* — Blank Rome LLP

(57) ABSTRACT

A superconducting magnet is provided for magnetic resonance imaging (MRI) or spectroscopy (MRS). The magnet has a plurality of discrete Niobium-Titanium superconductor coils arranged longitudinally along a common central axis, the Niobium-Titanium superconductor coils generating a first magnetic field when in use, the first magnetic field having high field regions of at least 5 Tesla radially inward of the discrete coils. At least two Niobium-Tin superconductor coils are located along the common central axis, each of which is located in a said high field region of the first magnetic field, the Niobium-Tin superconductor coils each generating a respective second magnetic field when in use, which combines with the first magnetic field to produce a resultant magnetic field which is of higher field strength than that of the first magnetic field at a location on the common central axis. The magnet is arranged to have a radial separation between each Niobium-Tin coil and the closest Niobium-Titanium coil to the respective Niobium-Tin coil, and there is an axial bore through the coils having a diameter of at least 150 mm.

13 Claims, 8 Drawing Sheets

(58) Field of Classification Search
CPC .. G01R 33/421; G01R 33/20; G01R 33/3815; H01F 6/00; H01F 6/06
USPC ....................................................... 335/216
See application file for complete search history.

(56) References Cited

U.S. PATENT DOCUMENTS

| | | | | |
|---|---|---|---|---|
| 5,280,247 | A * | 1/1994 | DeMeester | G01R 33/385 324/318 |
| 5,289,128 | A * | 2/1994 | DeMeester | G01R 33/385 324/318 |
| 5,764,121 | A * | 6/1998 | Wheatley | H01F 6/06 335/216 |
| 5,936,498 | A * | 8/1999 | Takeshima | G01R 33/3806 324/318 |
| 6,489,701 | B1 * | 12/2002 | Gamble | H02K 3/24 310/179 |
| 6,531,233 | B1 * | 3/2003 | Pourrahimi | H01L 39/02 428/107 |
| 7,319,329 | B2 * | 1/2008 | Huang | H01F 6/04 324/319 |
| 7,626,477 | B2 * | 12/2009 | Huang | G01R 33/3815 324/319 |
| 2002/0105402 | A1 * | 8/2002 | Crozier | G01R 33/3806 335/216 |
| 2004/0049108 | A1 * | 3/2004 | Ardenkjaer-Larsen | G01R 33/282 600/412 |
| 2004/0066193 | A1 * | 4/2004 | Ardenkjaer-Larsen | G01R 33/282 324/309 |
| 2006/0022779 | A1 * | 2/2006 | Jiang | H01F 6/04 335/216 |
| 2007/0171015 | A1 * | 7/2007 | Antaya | H05H 7/04 335/216 |
| 2007/0247263 | A1 * | 10/2007 | Calvert | G01R 33/3802 335/216 |
| 2009/0045894 | A1 * | 2/2009 | Aubert | G01R 33/3815 335/216 |
| 2009/0258788 | A1 * | 10/2009 | Miyazaki | C22C 9/02 505/510 |
| 2010/0117367 | A1 * | 5/2010 | Muller | H02K 3/47 290/53 |
| 2010/0244824 | A1 * | 9/2010 | Jiang | G01R 33/3802 324/309 |
| 2011/0012698 | A1 * | 1/2011 | Hutton | G01R 33/3802 335/216 |
| 2011/0015078 | A1 * | 1/2011 | Gao | G01R 33/3403 505/162 |
| 2011/0061399 | A1 * | 3/2011 | Chang | F25B 21/00 62/3.1 |
| 2011/0065584 | A1 | 3/2011 | Frantz | |
| 2011/0291782 | A1 * | 12/2011 | Calvert | G01R 33/3802 335/299 |
| 2012/0062230 | A1 * | 3/2012 | Vaughan, Jr. | G01R 33/3415 324/318 |
| 2012/0258862 | A1 * | 10/2012 | Liu | H01F 6/06 505/162 |
| 2013/0082702 | A1 * | 4/2013 | Blumhagen | G01R 33/56563 324/309 |
| 2013/0249443 | A1 * | 9/2013 | Antaya | H05H 7/10 315/502 |
| 2014/0038828 | A1 * | 2/2014 | Calvert | H01L 39/141 505/231 |
| 2014/0274721 | A1 * | 9/2014 | Calvert | G01R 33/3815 505/162 |
| 2016/0322144 | A1 * | 11/2016 | Hollis | H01F 6/06 |
| 2016/0351310 | A1 * | 12/2016 | Rey | H01L 39/24 |

* cited by examiner

SUPERCONDUCTING MAGNET

RELATED APPLICATIONS

This application claims the benefit of Great Britain Application No. 1507550.0, filed on May 1, 2015. The entire content of that application is incorporated herein by reference.

FIELD

The present invention relates to superconducting magnets. In particular, the invention relates to superconducting electromagnets for MRI or MRS uses.

BACKGROUND

A major use of superconducting magnets is in medical imaging. For example, superconducting electromagnets are by far the most common type of magnet used in MRI (Magnetic Resonance Imaging) and MRS (Magnetic Resonance Spectroscopy) machines, and are also commonly used in NMR (Nuclear Magnetic Resonance) Spectroscopy. In these applications, the superconducting electromagnets are typically arranged in one or more coils (i.e. superconducting wire being wound so as to form a cylinder to give each coil a particular number of windings), which are arranged with a common central longitudinal axis. The one or more coils of any particular piece of magnet equipment are typically configured to give a high degree of uniformity of magnetic field in the centre of the coils, such regions often being arranged as a bore.

Herein, the term "coil" can be thought of generally as a length of superconducting material wound in a loop with overlaid windings that are tightly wound together and along which a common current is caused to pass when in use. Usually, the superconductor material has a covering of insulating material, and only the coverings separate the windings of a single coil. The coils of superconducting magnets are held in cryostats with a longitudinal bore centred on and passing along the common central longitudinal axis of the coils. The cryostats also contain thermal insulation, and will usually contain chambers for cryogenic fluids, such as Helium or Nitrogen. This is because the superconducting magnets require cooling to cryogenic temperatures in order to function as superconducting magnets.

A commonly used material for superconducting electromagnets is Niobium-Titanium (NbTi). Niobium-Titanium coils are used as superconducting electromagnets in MRI scanners and MRS scanners over a range of field strengths. For example, Niobium-Titanium may be used in MRI scanners for clinical uses, which have a typical field strength of around 1.5 tesla (T). Higher field strength clinical systems are known and tend to have a field strength of about 3 T. Magnets with a field strength of around 7 T are generally only used outside of clinical fields, such as for research, as their use is not generally permitted for clinical uses/purposes at present.

As the required field strength increases, the size of the scanner increases since more coils are needed and greater cooling equipment is required. For example, for a high field strength (e.g. 5 T) MRI scanner using Niobium-Titanium coils, approximately 50,000 liters of liquid helium are required to cool down the coils to the operational base temperature, much of which is boiled off and recaptured during the cooling process. Once cooled, the temperature needs to be kept at the operational base temperature reliably and for as long as possible. Due to the size of such high field scanners, the expense of transporting, cooling, and operating the scanner is increased.

When using Niobium-Titanium, the size of the machine in which the coils are arranged increases because at a field strength greater than 5 T, a "compensated" solenoid configuration (such as the one shown in FIG. 1) is usually needed in order to maintain a low $B_{peak}/B_0$ ratio, where $B_{peak}$ is the peak local field strength experienced by a conductor within the coils, and $B_0$ is the field strength within the imaging volume of the scanner. This is because commercially available Niobium-Titanium conductors have a $B_{peak}$ of less than approximately 10 T at 4.2 kelvin (K) therefore requiring careful design to avoid the peak magnetic fields causing a magnet quench.

Compensated solenoid magnets typically include nested solenoids with one solenoid formed around another, as well as compensation coils around the nested solenoids. The compensation coils improve the homogeneity of the field produced by solenoid coils, which are of finite length. However, this makes the compensated solenoid magnets extremely large and heavy, causing them to be expensive to build, transport and install.

It is desirable to obtain a magnetic field with comparable homogeneity by using a discrete coil geometry (i.e. using a number of individual coils, each with a particular number of windings, arranged adjacent to each other along a common central longitudinal axis), instead of using a compensated solenoid magnet. This would make the size of the machine much smaller. Unfortunately, to achieve similar field strengths the peak local field in the superconductor would be far beyond the operational capability of Niobium-Titanium superconductors.

Further, due to the increasing expense of cryogens, there is a drive to use smaller volumes of cryogens where possible. Indeed, in some environments, the use of cryogens is either inappropriate or unacceptable. As such, when higher field strengths are required it is often a challenge to maintain an operating temperature that is low enough for the reliable use of a Niobium-Titanium material. This problem occurs because Niobium-Titanium has a low superconducting transition temperature. Without any field applied, Niobium-Titanium has a critical temperature of 9.3K. At the working current and background field of a superconducting magnet operating at a field strength of greater than about 5 T, the transition temperature of Niobium Titanium, and likely the critical field, would be exceeded.

There is therefore a desire to produce ultra-high field MRI and MRS magnets (e.g. of a field strength greater than 5 T), which are a practical size to allow for ease of transport, installation, and cooling.

SUMMARY OF INVENTION

According to a first aspect of the invention, there is provided a superconducting magnet for magnetic resonance imaging (MRI) or spectroscopy (MRS), comprising:
a plurality of discrete Niobium-Titanium superconductor coils arranged longitudinally along a common central axis, the Niobium-Titanium superconductor coils generating a first magnetic field when in use, the first magnetic field having high field regions of at least 5 Tesla radially inward of the discrete coils;
at least two Niobium-Tin superconductor coils located along the common central axis, each of which is located in a said high field region of the first magnetic field, the Niobium-Tin superconductor coils each generating a respective second magnetic field when in use, which combines with the first magnetic field to produce a resultant magnetic field which is of higher field strength than that of the first magnetic field at a location on the common central axis, wherein there is a radial separation between each Niobium-Tin coil and the closest Niobium-Titanium coil to the respective Niobium-Tin coil, and there is an axial bore through the coils having a diameter of at least 150 mm.

Essentially, this is a hybrid superconducting magnet for use in MRI or MRS using discrete Niobium-Titanium coils together with discrete Niobium-Tin (e.g. $Nb_3Sn$) coils positioned in high field regions so as to provide a bore of sufficient diameter to accommodate human limbs, animals, or other large scan subjects.

This further allows high field strengths to be used on a magnet system capable for example of scanning human subjects, whilst minimizing the overall size of the magnet system. The compact geometries that are enabled thereby reduce the costs of transporting, installing and cooling the magnet system.

As will be understood, for 1.5 T and 3 T Niobium-Titanium magnets, no solenoid is needed and instead, multiple discrete coils are used. This is possible because the local field of each coil is well below the maximum capability of approximately 10 T for Niobium-Titanium at 4.2K. For example, a 3 T Niobium-Titanium superconducting magnet can be reliably constructed with multiple discrete coils, each with a local field of approximately 5 T. Achieving higher fields causes problems when using Niobium-Titanium alone. By placing Niobium-Tin coils in high field locations of a "discrete coil geometry" of Niobium-Titanium coils, we have realised that the resultant magnetic field can be raised without the Niobium-Titanium coils reaching their maximum capability.

Essentially, an advantage of this superconducting magnet arrangement is that it allows higher field strengths to be achieved than when using only Niobium-Titanium in a discrete coil arrangement as well as reducing the amount of cryogens needed to cool the magnet to an operational temperature. In part, this is because Niobium-Tin has a critical temperature of about 18.3K, which is higher than the transition temperature of Niobium-Titanium.

However, Niobium-Tin is a difficult material to use in superconducting magnet coils. This is because for a Niobium-Tin coil to be able to function as a superconducting magnet, the Niobium-Tin needs to be reacted at 700° C. in a vacuum after having been wound into a coil geometry, so this makes Niobium-Tin superconducting magnets more difficult to produce. Further, once the Niobium-Tin has been reacted (i.e. baked), it becomes brittle making it fragile and liable to fracture if sufficient care is not taken. These problems make Niobium-Tin a rather a counter-intuitive material to use in superconducting magnets on a commercial scale, particularly higher field magnets.

Each coil may be embedded in a body, or may be supported in some other manner, such as supported by a separate structure, in each case the support being provided to withstand the forces generated within the magnet during operation. Each coil could be supported by its own former, or the Niobium-Titanium coils could all be supported on one common former, and the Niobium-Tin coils all be supported on a different common former. However, the superconducting magnet typically further comprises a cylindrical former along which the coils (of each material type) are located, the former being adapted to hold each coil in place. Using a cylindrical former allows all the coils to be positioned relative to a common body thereby reducing alignment and some other manufacturing problems that may arise. In turn, this improves the uniformity of the magnetic field in the bore.

Each coil may be held in place on the former by an adhesive such as a curable resin in which the windings are immersed. Other forms of attachment to the former are also contemplated which may alternatively or additionally be used, such as a wire overbinding or other form of strapping or bracing. In order to assist the attachment and localisation of the coils in their preferred geometry, typically one or more of the coils are located within a recess in the former.

By locating each coil in a recess, the precise position of each coil is able to be effected in accordance with the desired design of the magnet. This also ensures the position of the coil does not change during use nor during transportation and installation.

The recesses provided for each Niobium-Tin coil may be located anywhere along the length of the former depending on the location of the high field regions. Typically, the magnet system design is such that there is a recess at each end of the former that has a side of the recess open to an end of the former, each of said recesses having at least one Niobium-Tin coil located therein. Thus, the recess in this case may be thought of as represented by a single step change in radius of the former so as to define the region of the recess. This allows the Niobium-Tin coils to be baked independently from each other and from the former, as having recesses for each Niobium-Tin coil located at an end of the former with a side open to that end means that each Niobium-Tin coil can be slid in to position on to the former once the coil has been heat treated.

It is possible to arrange either all of the coils (i.e. the Niobium-Titanium coils and the Niobium-Tin coils) to be located around the outside of the former, all around the inside of the former or a combination of inside and outside, such as having at least two coils inside of the former and at least two coils outside of the former irrespective of which type of coil. Typically, the Niobium-Titanium coils are located on the outside of the former and the Niobium-Tin coils are located on the inside of the former. Thus, the Niobium-Tin coils may be positioned proximal to the bore with respect to the Niobium-Titanium coils. This arrangement allows the shape of the magnetic field to be maintained whilst the superconducting magnet is running. The current direction in the coils is such that the Niobium-Titanium coils generate a negative hoop stress (i.e. pull inwards to reduce their radius) when in use in the superconducting state, and the Niobium-Tin coils have a positive hoop stress (i.e. push outwards to increase their radius) when carrying superconducting current. This occurs because the axial component of the field typically reverses for the windings on the larger radius. As such, the two types of coils each push against the former instead of away from it. By pushing against the former, the shape of each coil is maintained ensuring the uniformity of the magnetic field.

Advantageously, locating the Niobium-Tin coils inside the former also allows the Niobium-Tin to be fitted to the former by a "shrink-fit" process, as the former can be heated to expand the diameter of the bore allowing the Niobium-Tin coils to be inserted into the former. The former then clamps onto the coils as it cools.

The former may be any non-magnetic material strong enough to support the coils when in use. A suitable material is austenitic stainless steel. Alternatively, using aluminium for the former ensures the former is light, whilst also being able to withstand the forces exerted upon it. This makes the superconducting magnet easier to transport.

There may be provided a joint shield wired in series with at least one of the Niobium-Tin coils. Niobium-Tin superconducting joints need to be located in a very low background magnetic field, and it is usually (although not always) necessary to locate these within a superconducting shield if no such low field location is available. It is possible to use a stand-alone joint shield, such as a stand-alone coil or cast as a solid piece of superconductor, which would accumulate its current by mutual inductance with the other coils as the magnet is ramped. However, instead of relying on mutual inductance, having a joint shield wired in series with the superconducting magnet provides a much more predictable current in the joint shield with a known, consistent and reliable shielding effect on the joint.

The joint shield may have the configuration of a Helmholtz coil. It would also be possible to actively shield the joint shield (or indeed the entire superconducting magnet) to reduce the Lorentz force on the joint shield and to minimise an impact on the magnetic homogeneity that the joint shield may have.

The superconducting magnet may be cooled through the use of cryogens such as liquid helium or, in part, liquid nitrogen and working on the principle of latent heat of vaporisation for the cooling effect. It is preferred however that the superconducting magnet is cooled using a cryocooler (mechanical refrigerator) and therefore is provided either with a cryogen-filled cooling circuit, for example including a recondensing system, or even is cooled using conduction alone and therefore does not rely on the existence of cryogenic fluids, removing the need for storing and/or recovering cryogenic materials from the superconducting magnet.

The at least two Niobium-Tin coils may be energisable independently of the plurality of discrete Niobium-Titanium coils. This allows the Niobium-Tin coils to be controlled independently of the Niobium-Titanium coils. This is advantageous as the independent control allows each type of coil to be operated at the most suitable/most effective conditions (such as the amount of current applied) for that coil type without being restricted to operating under the same conditions as the other coil type.

Of course, the Niobium-Tin coils and the Niobium-Titanium may be jointly energisable, which can be advantageous, as it allows a more simple control system to be used.

The at least two Niobium-Tin coils and the plurality of discrete Niobium-Titanium coils may be connected thereby allowing a common current to be applied to the coils. This allows the coils to be simultaneously controlled and for a single current source to be used, which simplifies the control system of the superconducting magnet.

BRIEF DESCRIPTION OF FIGURES

Some examples of superconducting magnets according to the invention are now described with reference to the accompanying drawings, in which.

DETAILED DESCRIPTION

The example superconducting magnets described herein represent a development over known superconducting magnets since they allow the superconducting magnets to be lighter and more compact than known superconducting magnets with comparable field strengths. They also enable higher field strengths to be produced in comparison with known superconducting magnets of a comparable size. This is achieved by using at least two different types of superconducting electromagnets to form a hybrid magnet.

Figure 1:
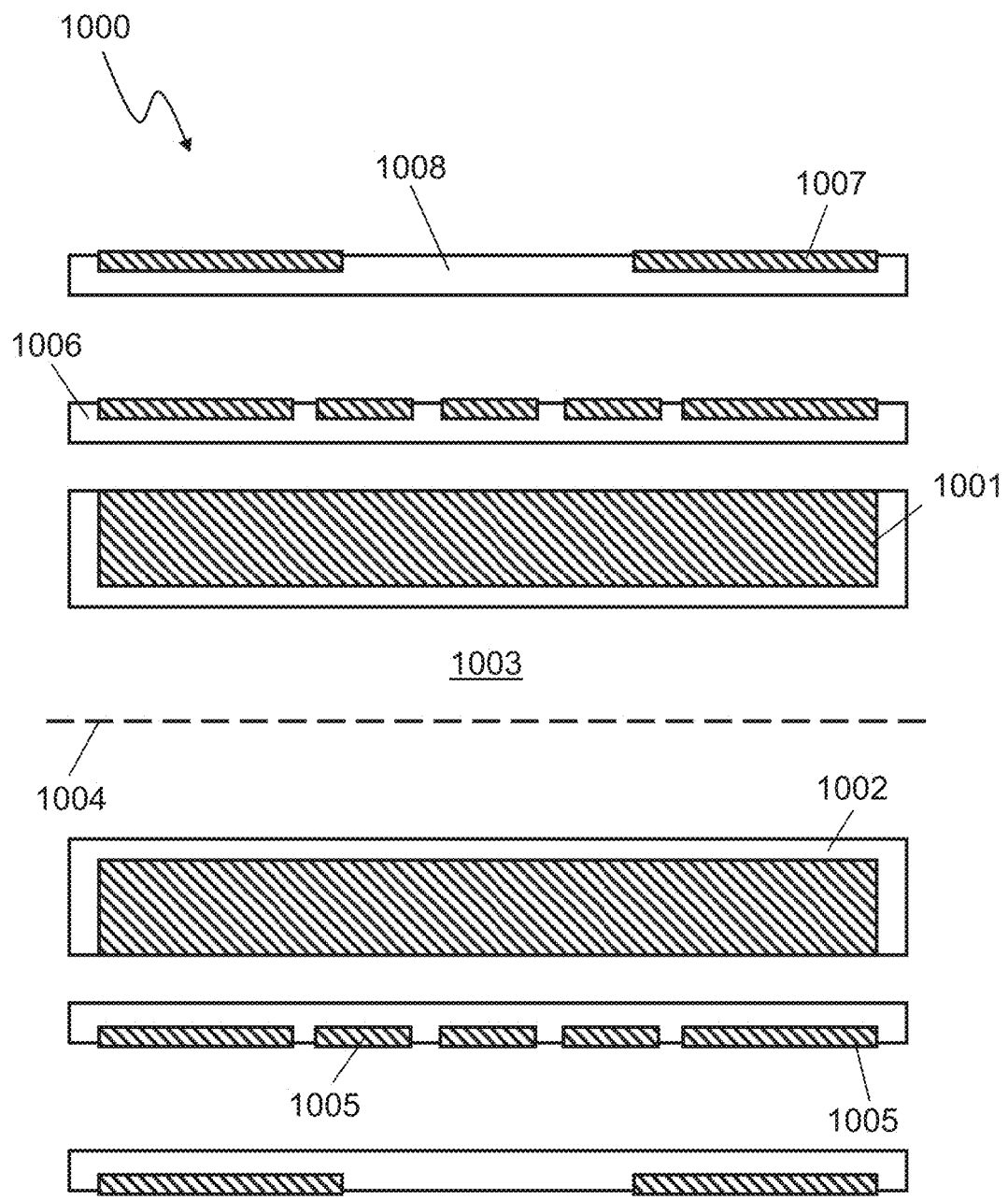
FIG. 1 shows a schematic cross-sectional view along the length of a prior art superconducting magnet.

As mentioned earlier, conventional superconducting magnets for use in MRI and MRS that use Niobium-Titanium coils and operate at a field strength of 5 T or greater are built on a "compensated solenoid configuration" as shown in FIG. 1. This shows a superconducting magnet 1000 with a Niobium-Titanium solenoid 1001 wound around a former 1002 through which there is a bore 1003.

In some compensated solenoid superconducting magnets, there may be a number of solenoids. The solenoids are nested (i.e. they form concentric cylinders having a common central longitudinal axis, such as axis 1004 in FIG. 1), which gives a higher field strength. In FIG. 1, there is only one solenoid coil around which are located a number of compensation coils 1005. Each of these coils is wound onto a second former 1006 thereby providing a separate support from the former 1002 onto which the solenoid 1001 is wound. The compensation coils 1005 are each discrete coils, each with a particular number of windings; and the second former takes the general form of a hollow cylinder fitted around the first former, with the central longitudinal axis of the second former is collinear with the central longitudinal axis 1004 of the solenoid.

In order to contain the fringe field of the superconducting magnet 1000, the superconducting magnet also has shield coils 1007 supported by a third former 1008. These are separate from the solenoid and the compensation coils.

When using Niobium-Titanium coils, a superconducting magnet of this form can produce magnetic fields with strengths of 5 T or greater. However, such superconducting magnets are large and so are difficult to transport, install and cool to the appropriate operating temperature. This is due to the large amount of Niobium-Titanium that is needed as well as the having a number of separate formers to hold the coils. This makes use of such superconducting magnets impractical in many applications. Due to the operational limitations of Niobium-Titanium coils, even the strongest compensated solenoid superconducting magnet made with Niobium-Titanium will have a maximum magnetic field strength of around 10 T at 4.2K.

Figure 2:
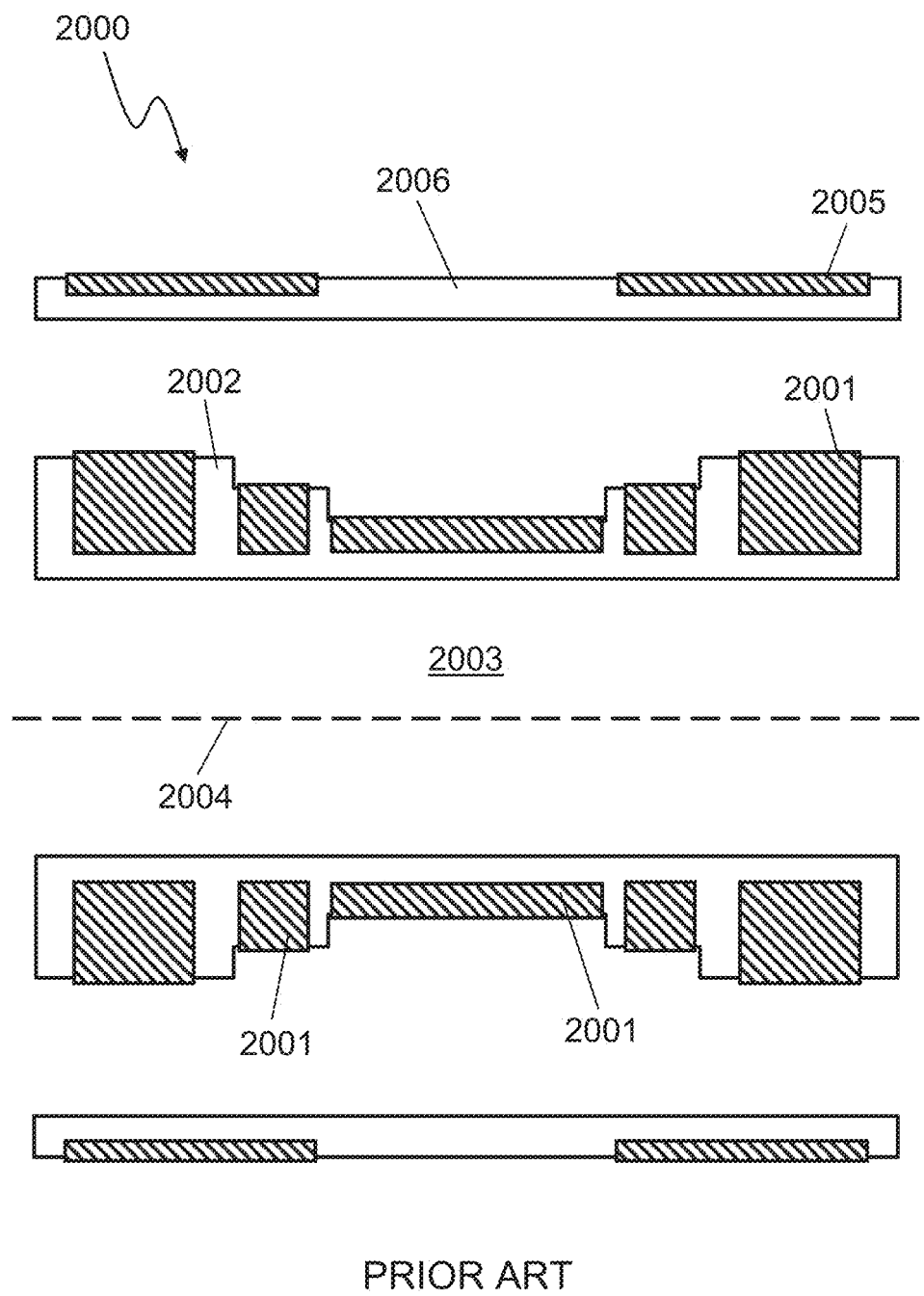
FIG. 2 shows a cross-sectional view of an alternative prior art superconducting magnet.

By changing the configuration of the superconducting magnet, the size and weight can be reduced. For example, by using a "discrete coil geometry" as shown in FIG. 2, the need for a single large solenoid extending the entire length of the superconducting magnet can be avoided. Instead of having a single large solenoid, a superconducting magnet

2000 built on a discrete coil geometry as shown in FIG. 2 has a plurality of individual coils 2001 (each of which has a specified number of windings). The individual coils are usually held on a single former 2002, which, like the compensated solenoid superconducting magnet of FIG. 1, has a bore 2003 through its centre and ensures that the coils each have their axis of rotational symmetry aligned along the a common central longitudinal axis 2004. In order to achieve the desired field distribution, the number of windings and the shape of each coil is carefully designed so that each coil makes the appropriate contribution to the total resultant magnetic field.

As with the superconducting magnet shown in FIG. 1, a superconducting magnet with a discrete coil geometry may also have shield coils 2005 held on a former 2006 around the discrete coils.

A problem encountered when using a Niobium-Titanium coils in a discrete coil arrangement is that the maximum field strength achievable in the magnet bore is around 3 T to 5 T. This is because, with a peak field strength ($B_{peak}$) capability of less than about 10 T at 4.2K, Niobium-Titanium is incapable of creating a higher resultant field strength in the magnet bore when using a discrete coil geometry due to the reduction in field strength provided as the distance from each superconducting coil increases. The reason that higher field strengths are not achievable at 4.2K is that the superconducting current cannot be maintained above this field strength.

The physical cause of the peak field limitation is that the local peak fields within the coil can be substantially higher than the working field in the bore of the magnet. This is because the field experienced by each given superconducting coil is the combined effect of the magnetic fields produced by all of the superconducting coils that make up the superconducting magnet. In order to create a field with as high a homogeneity as possible within the centre of the magnet, i.e. through/in the bore, it is necessary to configure the geometry of the superconducting magnet such that the field is substantially raised at the ends of the bore. This is especially the case when the superconducting magnet has a short axial length. When the field strength is raised at the ends of the bore, this causes high local fields in the conductors, particularly within the larger coils at the axial ends of the superconducting magnet.

However, we have found that using a hybrid magnet with a discrete coil geometry using discrete Niobium-Tin coils as well as discrete Niobium-Titanium coils enables higher field strengths to be achieved whilst ensuring the superconducting magnet as a whole is as light and compact as possible for use in MRI and MRS applications with a bore diameter through the superconducting magnet of equal to or greater than 150 mm.

This is made possible as Niobium-Tin remains superconducting at higher peak field strengths than 10 T at 4.2K. For example, the maximum peak field strength of Niobium-Tin at 4.2K is greater than 20 T. Further, Niobium-Tin also remains superconducting at higher temperatures than Niobium-Titanium, which enables a superconducting magnet using Niobium-Tin to have increased temperature margins. This can be beneficial, as with large conduction cooled magnets, there will be a variation in temperature across the structure, depending on the heat conduction path to the cryocooler, and heat contributions due to radiation, conduction from the structure and e.g. stimulation from an MRI gradient coil. Usually this would make the superconducting magnet more susceptible to a quench. However, due to the increased temperature margins of a superconducting magnet using Niobium-Tin, such a superconducting magnet has an improved response to local temperature modulations, and is therefore less susceptible to a quench.

Figure 3:
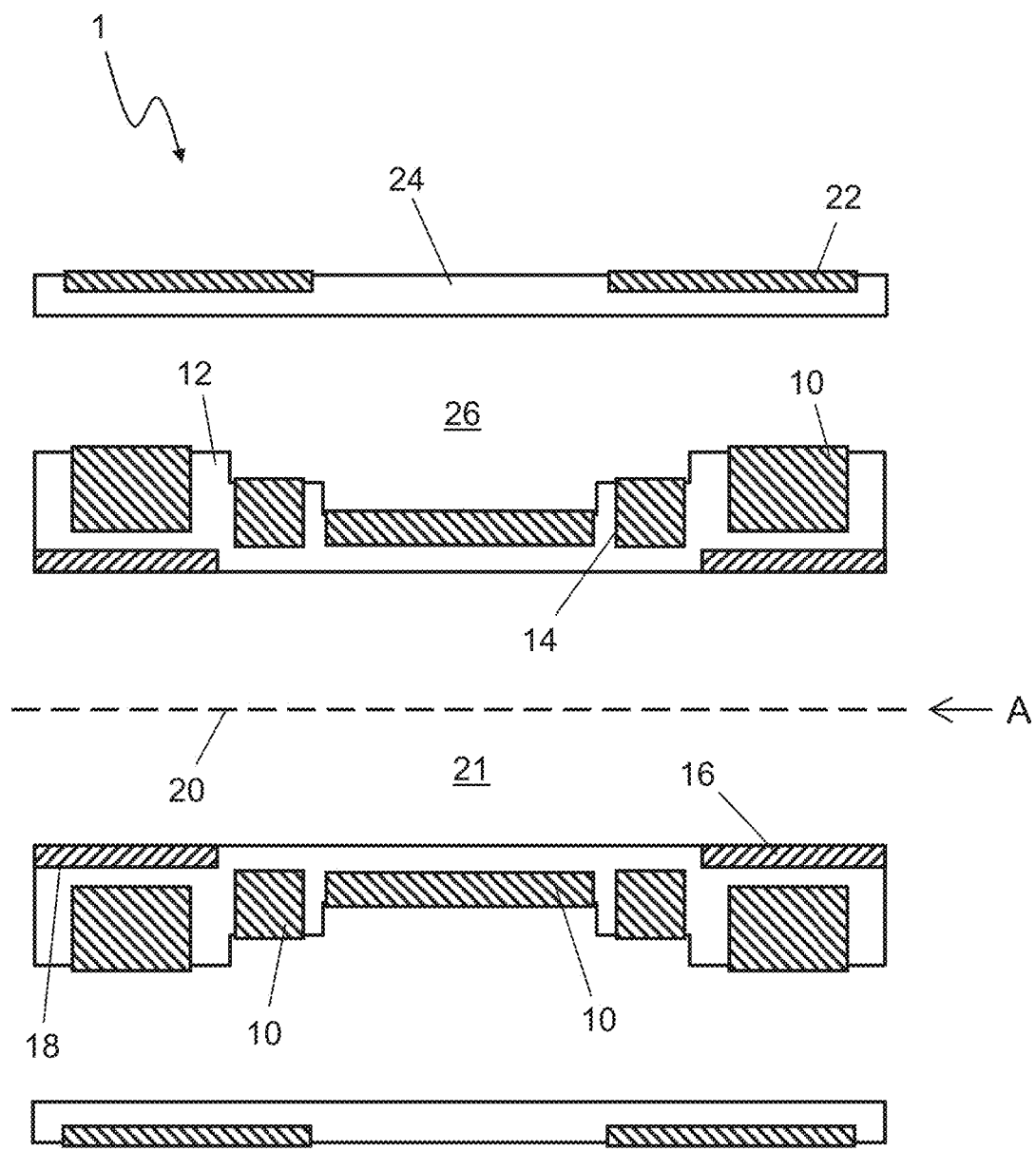
FIG. 3 shows a cross-sectional view of a first example of the invention along the length of the superconducting magnet.

A first example of such a hybrid system 1 is shown in FIG. 3. This has a discrete coil geometry similar to that shown FIG. 2. In FIG. 3, five Niobium-Titanium coils are each wound around the outside of a cylindrical former 12. The former has circumferential recesses 14 (rectangular cross-section) in which each of the Niobium-Titanium coils are held. As can be seen from FIG. 2, the coils 10 are arranged so as to be distributed symmetrically about a mirror plane that bisects the magnet axis. An outer pair of similarly sized coils is positioned adjacent the ends of the former 12. An inner pair of smaller cross-sectional area is distributed such that each coil is located approximately equidistant between the central mirror plane and the respective end of the former. The remaining fifth coil is elongate in its dimension parallel to the central axis of symmetry of the magnet and relatively narrow in a radial direction with respect to the other Niobium-Titanium coils. This fifth coil is located centrally along the length of the magnet and straddles the mirror plane at the centre of the magnet. This distribution of the coils, along with the shape, size and number of windings of each coil, is chosen when designing the superconducting magnet to give the desired field distribution. In this embodiment, the distribution of the Niobium-Titanium coils produces regions of relatively high magnetic field strength, such as 9 T or greater, radially inward and adjacent the outer pair of coils positioned at each end of the former 12.

It would also be possible to locate a Niobium-Tin coil in a region with lower field strength. A Niobium-Tin coil would be provided in such a region when the temperature in that region is greater than 4.2K, for example, when there is a long conduction path to the cryocooler, or there is stimulation from an MRI gradient coil, raising the temperature of a particular region.

In the example shown in FIG. 3, two Niobium-Tin coils 16 are positioned in these high field regions of the magnetic field generated by the Niobium-Titanium coils. The Niobium-Tin coils are located on the inner surface of the former (that which forms the boundary of the bore). The Niobium-Tin coils are held in recesses 18 at the ends of the former. Unlike the recesses 14 which have opposing planar walls of equal radial height (and each with a plane normal parallel to the central axis of the magnet), in the case of the recesses 18 only one such wall is provided which faces away from the centre of the magnet. Thus, the recesses each have a side that is "open" to the end of the former, such that the inner bore wall of the former exhibits a stepped increase in radius at the boundary of each recess 18, this radius then remaining constant to the end of the former. Thus, the recesses 14 for the outer pair of Niobium-Titanium coils and the recesses 18 for the Niobium-Tin coils are positioned in a co-axial arrangement (at a similar axial position). In this case, the axial length of the Niobium-Tin coils is greater than that of the outer pair of Niobium-Titanium coils and these latter coils are positioned centrally with respect to the axial position of the Niobium-Tin coils. A radial separation (i.e. a gap in a radial direction) between the Niobium-Tin coils and the Niobium-Titanium coils is provided in the former, keeping them radially separated and unable to mechanically interact with each other.

The current flow directions within the Niobium-Tin coils located on the inside of the former and the Niobium-Titanium coils located on the outside of the former helps keep the coils in place. When operating, the Niobium-Tin coils push radially outwards exhibiting "positive hoop stress". As they are located inside the former, they push against the former and maintain their shape rather than pushing outwards from the former and deform due to movement of the coil relative to the former. Whilst the Niobium-Tin coils exhibit a predominantly positive hoop stress, the Niobium-Titanium coils exhibit a predominantly "negative hoop stress", i.e. the pull radially inward when operating as a superconductor. As they are located on the outside of the former, they push against the former instead of pulling out from former as they would if they were located on the inside. Further, keeping the two types of coil separate means that they do not push against each other directly when operating as superconductors, which keep them from damaging the other coil when in use.

As with the prior art superconducting magnet shown in FIG. 2, all the coils of the superconducting magnet shown in FIG. 3 are positioned and orientated so that they are aligned along a single central longitudinal axis 20, which runs along and is aligned with the central longitudinal axis of the bore 21 through the former 12. The minimum diameter for the bore is 150 mm, but preferably, it is larger than this, which of course requires more powerful magnets to provide a similar on-axis field strength due to the additional radial projection distance required.

The positioning of the Niobium-Tin coils in high field regions of the magnetic field producible by the Niobium-Titanium coils assists in raising the overall field strength of the superconducting magnets. The Niobium-Tin coils each produce a magnetic field that combines with the magnetic field created by the Niobium-Titanium coils when both sets of coils are in a superconducting state. This allows the resulting field strength in the bore to be raised to a level that is greater than that which can be achieved using Niobium-Titanium coils alone in a discrete non-compensated system.

Depending on the how the coils of the superconducting magnet are to be controlled, in some examples, the Niobium-Tin coils are energisable independently from the Niobium-Titanium coils, and, in other examples, the Niobium-Tin coils and the Niobium-Titanium coils are jointly energisable. When the two coil types are jointly energisable, usually a common current will be passed along the coils in use. The purpose for which the superconducting magnet is to be used will likely determine which is the most suitable method by which to control the coils.

The embodiment shown in FIG. 3 also has shield coils 22 located on a second former 24. Whilst the shield coils are included here, they are not essential to the production of the magnetic field within the bore and as such may be excluded from all examples. Nevertheless, such shield coils are useful practically in reducing stray magnetic fields exterior to the magnet system. As can be seen from FIG. 3, and FIG. 4 (which shows an end-on view of the example shown in FIG. 3), there is a space 26 between the former 12 holding the Niobium-Titanium and Niobium-Tin coils and the second former 24. The separation of the formers assists in creating an efficient geometry of the superconducting magnet. This also allows some components of the superconducting magnet to be positioned between the formers, such as superconducting shims, switches, superconducting joints and quench protection components.

To manufacture the example superconducting magnet described, the Niobium-Tin coils are preferably wound before being fitted to the former. This can be achieved using conventional methods for winding superconducting coils. Usually the Niobium-Tin coils would each be wounded onto temporary tooling, such as a (type of) former. The Niobium-Tin is then "baked" (usually at 700° C. or higher) to react the coil material for use. The coils then go through an impregnation process before extracting the tooling and fitting to the former. However, due to the baking, the Niobium-Tin coils become brittle so care needs to be taken when fitting them to the former.

As the coils are made to a precise shape and are an exact fit to the former, in order to fit the Niobium-Tin coils to the former, it is preferable to use the thermal expansion of the former to provide a sufficient increase in dimensions to allow the Niobium-Tin coils to be fitter to the former. As will be understood, the shape of the recesses 18 allows the Niobium-Tin coils to be inserted in an axial direction into their position within the recess. During this operation the former could be heated, such as up to a maximum temperature of about 200 degrees centigrade (° C.) or less, such as about 150° C., about 100° C., or about 80° C., to slightly increase the bore and recess diameter sufficiency to allow the Niobium-Tin coils to be slid into position. Usually, the former is heated to about 100° C. The former is then allowed to cool causing the former to shrink and "clamp" onto the Niobium-Tin coils. This is therefore a "shrink-fit" construction technique, which is particularly useful in the case of Niobium-Tin coils due to the requirement for them to be baked once wound in position.

Instead of (or in addition to) heating the former, a technique of gently cooling the coils (e.g. with Nitrogen, such as liquid Nitrogen) may be used. This shrinks the diameter of the coils allowing each coil to be slid into position. The former then clamps onto the Niobium-Tin coils when they warm up. This is also a shrink-fit construction technique.

When the former has cooled sufficiently, the Niobium-Titanium coils are wound directly onto the former as these do not need any form of heat treatment to be able to operate as superconducting magnets at the appropriate temperature. It would also be possible for the Niobium-Titanium coils to be wound onto the former before it is heated. For the Niobium-Titanium coils to withstand the heating of the coil, they could be cooled with nitrogen gas and/or it would be possible to leave a small gap between the Niobium-Titanium coils and the former, as this would close when the magnet cools down.

Figure 6:
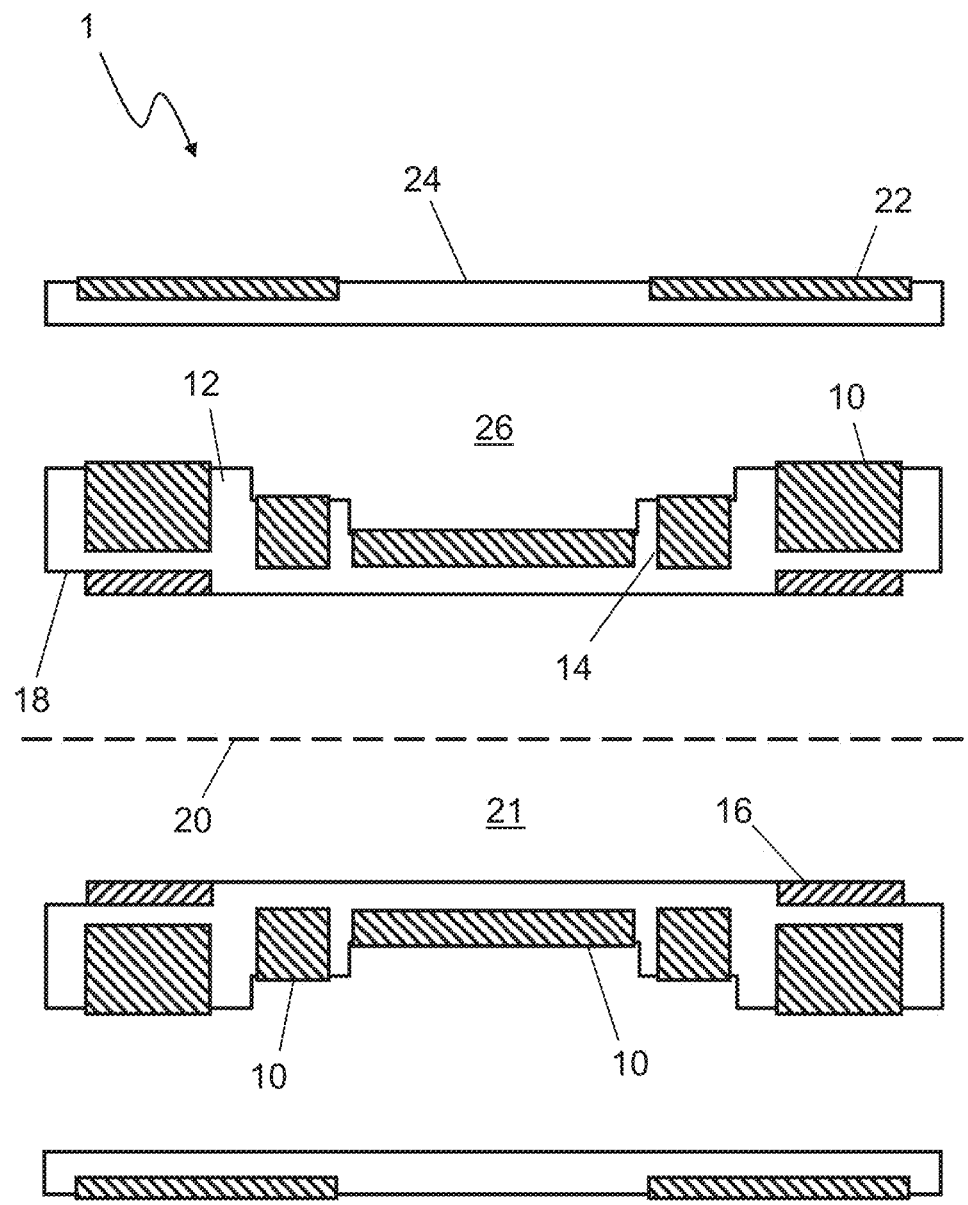
FIG. 6 shows a cross-sectional view of another example of the invention along the length of the superconducting magnet.

The example in FIG. 3 shows Niobium-Tin coils that are equal in axial length to the axial length of the recesses 18 in which they are held. However, in another example, as shown in FIG. 6, the Niobium-Tin coils 16 can be shorter in axial length than the recesses in which they are held. They may be of equal axial length to the corresponding radially adjacent Niobium-Titanium coils 10, or they may be of a different axial length (see FIG. 3). All other components of the example shown in FIG. 6 are the same as the example shown in FIG. 3.

Figure 5:
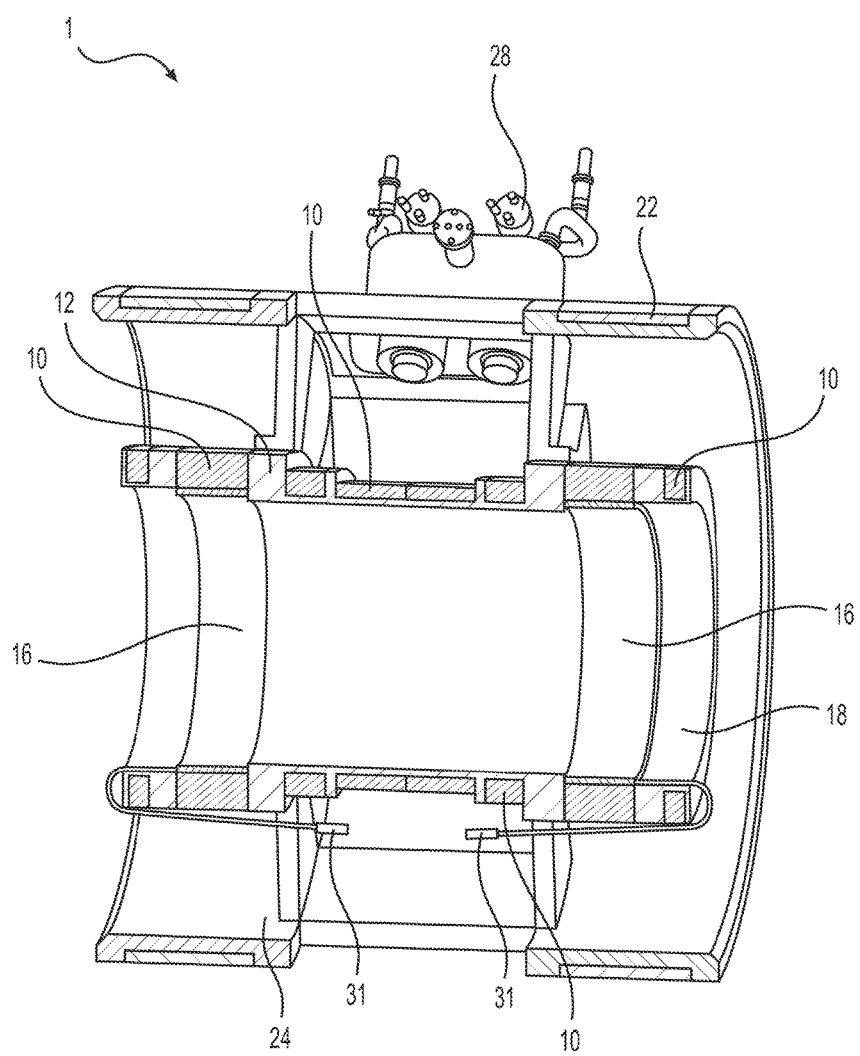
FIG. 5 shows a sectional perspective view of another example of the invention.

A further example is shown in FIG. 5. This shows a superconducting magnet system 1 similar to that shown in FIG. 3 with an elongated former 12. The Niobium-Tin coils 16 fit at an internal end of the recesses 18 in which they are held (instead of at an external end that is open to the end of the former). They can be seen as two wide circumferential bands on the inside of the bore. In this case, the former has additional Niobium-Titanium coils located at each end. These are used to influence the shape of the field to make it more uniform in the axial portion of the bore between the two Niobium-Tin coils and to control the distribution of the magnetic field at the ends of the former. As will be understood, depending on the magnet design, other sets of coils may be used to increase the working volume of high homogeneity magnetic field within the bore.

The embodiment shown in FIG. 5 again has the shield coils 22 held on a separate former as shown in FIG. 3. However, FIG. 5 also shows the cooling mechanism of the superconducting magnet. In this case, a pair of cryocoolers 28 is used.

In the embodiment shown in FIG. 5, the volume between the formers 12, 24 is filled with liquid helium. The cryocoolers 28 are two-stage cryocoolers, and the first stage of each cryocooler is thermally attached to the radiation shield, and the second stage is attached to a recondenser that converts helium gas into liquid, which effectively creates a zero boil off or minimal boil off system.

Due to the reduced size of the superconducting magnet of a compensated solenoid arrangement, and the higher operating temperature allowed by the use of Niobium-Tin coils, cryocoolers can be used to cool the superconducting magnets of the examples described herein to keep them at the desired operational (i.e. sub-critical/superconducting) temperature. This means, according to the specific design that relatively small volumes of cryogens or even no cryogens at all (conductive cooling) need to be used to cool the magnet.

Figure 7:
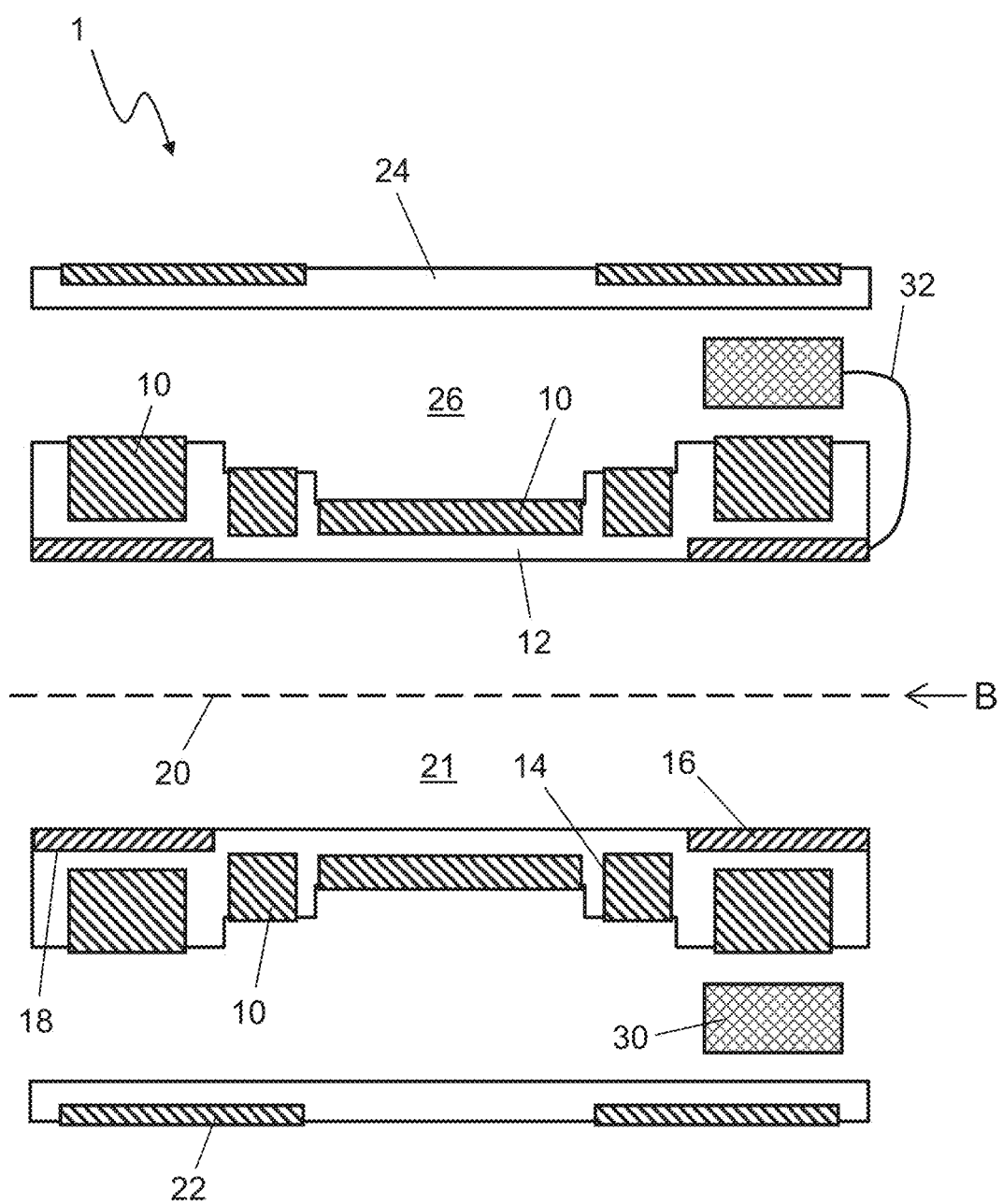
FIG. 7 shows a cross-sectional view of another example of the invention along the length of the superconducting magnet.

Yet another example is shown in FIG. 7. This shows a superconducting magnet 1 with the same coil arrangement as the superconducting magnet shown in FIG. 3. However, this example includes a joint shield 30 connected in series with a Niobium-Tin coil 16 by a superconducting wire 32. The joint shield is a standalone (superconducting) coil, but could be cast as a solid piece of superconductor as shown in FIG. 5 as reference numeral 31, its function being to exclude magnetic fields from an interior volume.

The joint shield provides magnetic shielding to one or more power couplings (not shown) to the Niobium-Tin coils 16 (and could, if appropriately connected, provide magnetic shielding for one or more power couplings to the Niobium-Titanium coils 10). Niobium-Tin superconducting joints need to be located in a very low background field. To help accomplish this, the superconducting shield is used. By being connected in series with the superconducting magnet, the current in the superconducting shield is predictable and therefore offers a known amount of shielding. There may of course be more than one superconducting shield. Preferably, each superconducting joint shield is joined in series with the superconducting magnet.

It would also be possible for the superconducting shield to have the configuration of a Helmholtz coil and for it to be actively shielded. A Helmholtz configuration would increase the size of the shielded region and active shielding of the joint-shield would eliminate any field contribution thereof within the imaging volume. Furthermore, actively shielding the joint shield reduces the Lorentz force experienced by each superconducting coil.

Figure 4:
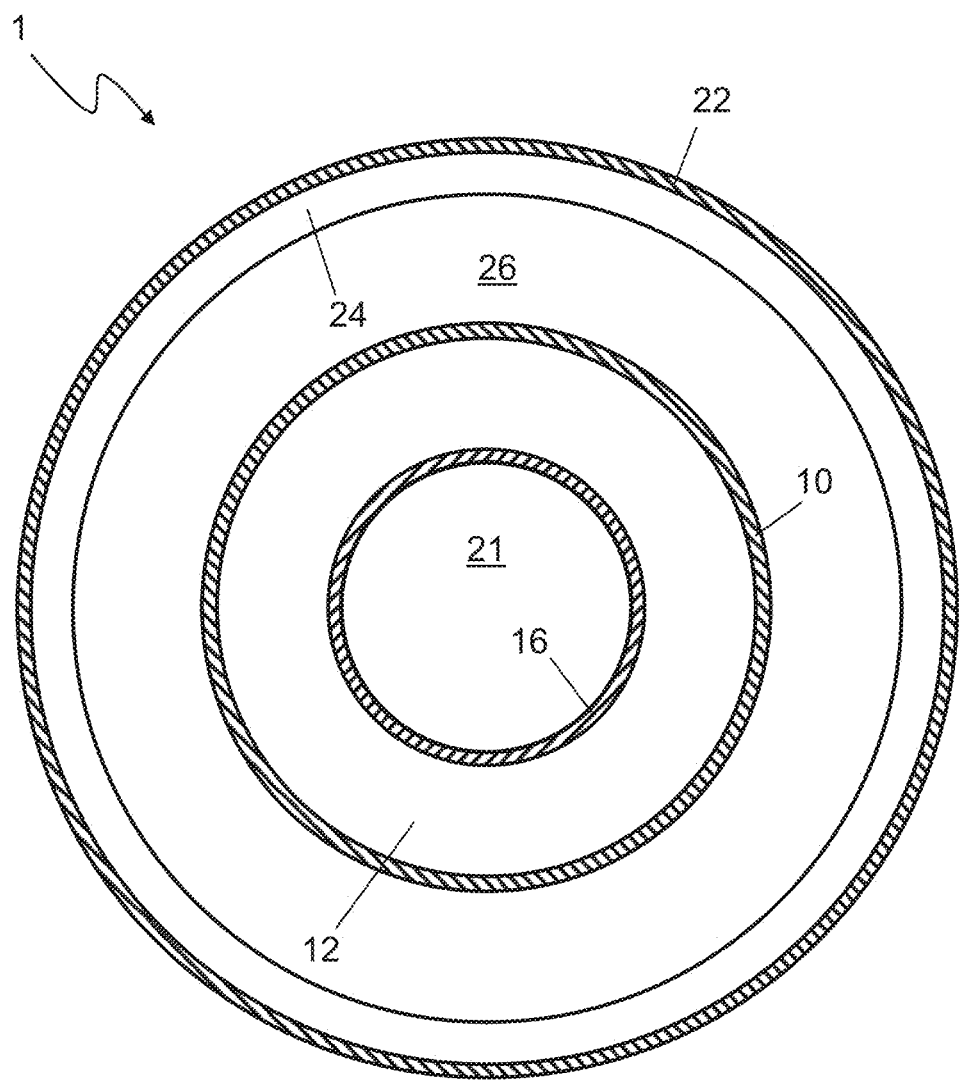
FIG. 4 shows a sectional view of the first example shown in FIG. 3 from direction A in FIG. 3.
Figure 8:
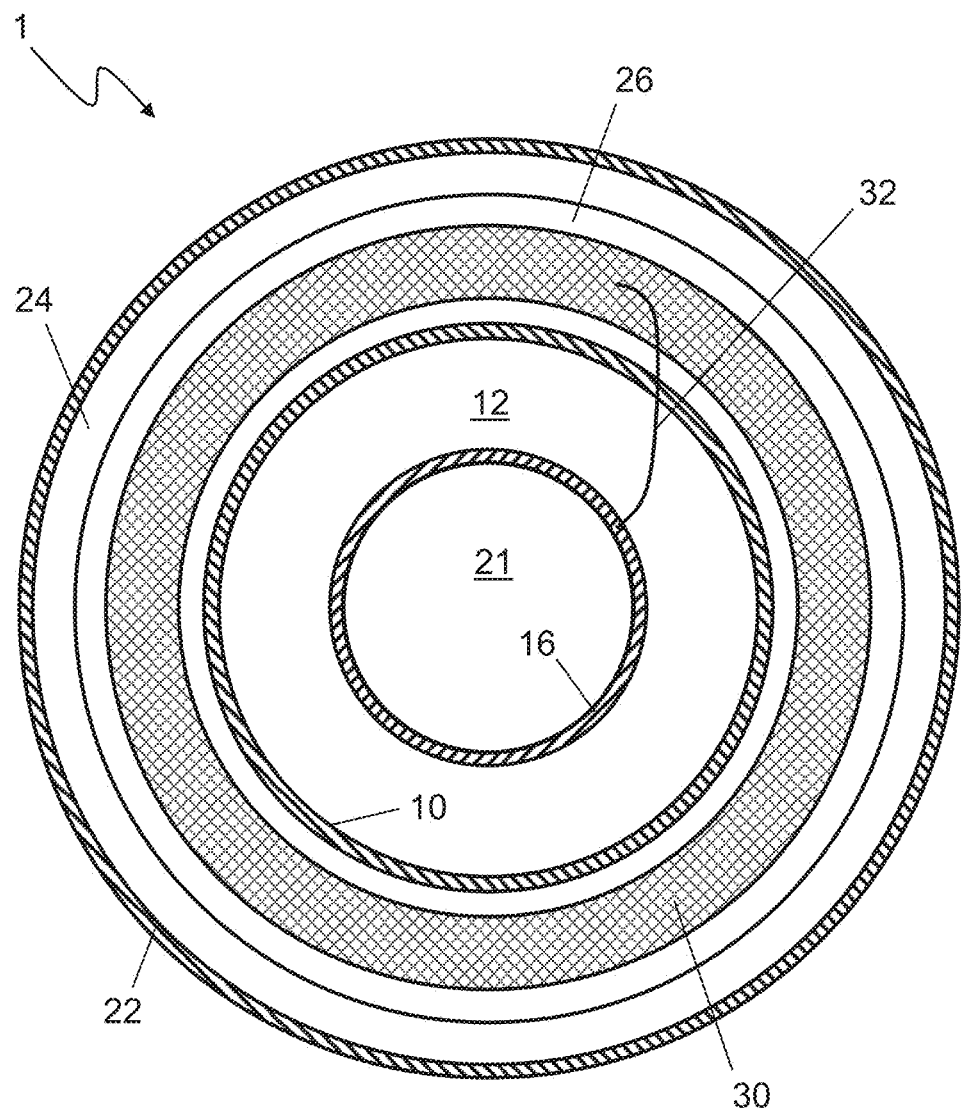
FIG. 8 shows a sectional view of the example shown in FIG. 7 from direction B in FIG. 7.

FIG. 4 and FIG. 8 show end-on views of the two examples of FIGS. 3 and 7 respectively. Essentially, these show the alignment and position of the various coils (Niobium-Tin coils 16, Niobium-Titanium coils 10, shield coils 22, and the joint shield 30 in FIG. 8) around central bore 20. This arrangement is used to allow the superconducting magnet to be used for MRI and MRS scanners. In particular, they are to be used for human and animal scale scanners, including full body scanners.

The use of Niobium-Tin coils in the hybrid superconducting magnet arrangements described allows larger superconducting magnets to be produced with low or no cryogen usage and which can be cooled by cryocoolers. For example, using a hybrid superconducting magnet such as those described above, it is possible to produce a conduction-cooled 3 T whole-body MRI scanner that is cooled by a 1.5 W (Watt) cryocooler. This is due to the greater temperature margin available when using Niobium-Tin. This can also be achieved with superconducting magnets with larger bore diameters, such as those with a bore diameter of around 500 mm.

The invention claimed is:

1. A superconducting magnet for magnetic resonance imaging (MRI) or spectroscopy (MRS), comprising:
a plurality of discrete Niobium-Titanium superconductor coils arranged longitudinally along a common central axis, the Niobium-Titanium superconductor coils generating a first magnetic field when in use, the first magnetic field having high field regions of at least 5 Tesla radially inward of the discrete coils;
at least two Niobium-Tin superconductor coils located along the common central axis, each of which is located in one of the high field regions of the first magnetic field, the Niobium-Tin superconductor coils each generating a respective second magnetic field when in use, which combines with the first magnetic field to produce a resultant magnetic field which is of higher field strength than that of the first magnetic field at a location on the common central axis, wherein
there is a radial separation between each Niobium-Tin coil and the closest Niobium-Titanium coil to the respective Niobium-Tin coil, and there is an axial bore through the coils having a diameter of at least 150 mm.

2. A superconducting magnet according to claim 1, further comprising a cylindrical former along which the coils are located, the former being adapted to hold each coil in place.

3. A superconducting magnet according to claim 2, wherein each coil is located in a recess in the former.

4. A superconducting magnet according to claim 3, wherein there is a recess at each end of the former that has an external end open to an end of the former, each of the recesses having at least one of the Niobium-Tin superconductor coils located therein.

5. A superconducting magnet according to claim 2, wherein the Niobium-Titanium superconductor coils are located on an exterior surface of the former and the Niobium-Tin coils are located on an interior surface of the former.

6. A superconducting magnet according to claim 2, wherein the former is formed from Aluminium.

7. A superconducting magnet according to claim 2, wherein there is a recess at each end of the former that has an external end open to an end of the former, each of the recesses having at least one of the Niobium-Tin superconductor coils located therein, and wherein the Niobium-Tin coils are located within the recesses on an interior surface of the former.

8. A superconducting magnet according to claim 7, wherein the Niobium-Tin coils are positioned at internal ends of the recesses opposite the external ends of the recesses.

9. A superconducting magnet according to claim 8, wherein the Niobium-Titanium superconductor coils are located on an exterior surface of the former, and wherein the superconducting magnet further comprises additional Niobium-Titanium superconductor coils located at the external ends of the recesses.

10. A superconducting magnet according to claim 1, further comprising a joint shield wired in series with at least one of the Niobium-Tin superconducting coils.

11. A superconducting magnet according to claim 1, wherein the superconducting magnet is a cryogen-less superconducting magnet.

12. A superconducting magnet according to claim 1, wherein the at least two Niobium-Tin coils are energisable independently of the plurality of discrete Niobium-Titanium coils.

13. A superconducting magnet according to claim 1, wherein the at least two Niobium-Tin coils and the plurality of discrete Niobium-Titanium coils are connected thereby allowing a common current to be applied to the coils.

* * * * *